US006753744B2

(12) United States Patent
Killen et al.

(10) Patent No.: US 6,753,744 B2
(45) Date of Patent: Jun. 22, 2004

(54) HIGH EFFICIENCY THREE PORT CIRCUIT

(75) Inventors: William D. Killen, Melbourne, FL (US); Randy T. Pike, Grant, FL (US)

(73) Assignee: Harris Corporation, Melbourne, FL (US)

( * ) Notice: Subject to any disclaimer, the term of this patent is extended or adjusted under 35 U.S.C. 154(b) by 35 days.

(21) Appl. No.: 10/185,215

(22) Filed: Jun. 27, 2002

(65) Prior Publication Data

US 2004/0000961 A1 Jan. 1, 2004

(51) Int. Cl.[7] ................................. H01P 5/02
(52) U.S. Cl. ...................... 333/33; 333/246
(58) Field of Search ............................ 333/33, 246, 32

(56) References Cited

U.S. PATENT DOCUMENTS

| | | |
|---|---|---|
| 3,571,722 A | 3/1971 | Vendelin |
| 3,678,418 A | 7/1972 | Woodward |
| 4,495,505 A | 1/1985 | Shields |
| 4,525,720 A | 6/1985 | Corzine et al. |
| 4,800,344 A | 1/1989 | Graham |
| 4,825,220 A | 4/1989 | Edward et al. |
| 4,882,553 A | 11/1989 | Davies et al. |
| 4,916,410 A | 4/1990 | Littlefield |
| 4,924,236 A | 5/1990 | Schuss et al. |
| 5,039,891 A | 8/1991 | Wen et al. |
| 5,148,130 A | 9/1992 | Dietrich |
| 5,379,006 A | 1/1995 | McCorkle |
| 5,455,545 A | 10/1995 | Garcia |
| 5,523,728 A | 6/1996 | McCorkle |
| 5,604,017 A | 2/1997 | Frankosky |
| 5,678,219 A | 10/1997 | Agarwal et al. |
| 5,777,526 A | 7/1998 | Kawasaki |
| 6,052,039 A | 4/2000 | Chiou et al. |
| 6,114,940 A | 9/2000 | Kakinuma et al. |
| 6,133,806 A | 10/2000 | Sheen |
| 6,137,376 A | 10/2000 | Imbornone et al. |
| 6,184,845 B1 | 2/2001 | Leisten et al. |
| 6,307,509 B1 | 10/2001 | Krantz |

FOREIGN PATENT DOCUMENTS

| | | |
|---|---|---|
| FR | 2 815 487 A | 4/2002 |
| JP | 2000 223910 A | 8/2000 |

OTHER PUBLICATIONS

U.S. patent application Ser. No. 10/448,973, Delgado et al., filed May 30, 2003.
U.S. patent application Ser. No. 10/184,277, Killen et al., filed Jun. 27, 2002.
U.S. patent application Ser. No. 10/185,443, Killen et al., filed Jun. 27, 2002.
U.S. patent application Ser. No. 10/184,332, Killen et al., filed Jun. 27, 2002.
U.S. patent application Ser. No. 10/185,251, Parsche et al., filed Jun. 27, 2002.
U.S. patent application Ser. No. 10/185,847, Killen et al., filed Jun. 27, 2002.

(List continued on next page.)

*Primary Examiner*—Don Le
(74) *Attorney, Agent, or Firm*—Sacco & Associates, PA

(57) ABSTRACT

A circuit (100) for processing radio frequency signals includes a substrate (50) where the circuit can be placed. The substrate can be a meta-material and can incorporate at least one dielectric layer (20, 30, or 40). The circuit such as a three port circuit and at least one ground can be coupled to the substrate. The dielectric layer can include a first region (40) with a first set of substrate properties and a second region (20) with a second set of substrate properties. Substrate properties can include permittivity and permeability. A portion (32 or 46) of the three port circuit can be selectively coupled to the second region. The permittivity and/or permeability of the second region can be higher than the permittivity and/or permeability of the first region. The increased permittivities and/or permeabilities can reduce a size of the three port circuit and effect a change in a variety of electrical characteristics associated with the three port circuit.

17 Claims, 2 Drawing Sheets

OTHER PUBLICATIONS

U.S. patent application Ser. No. 10/185,275, Killen et al., filed Jun. 27, 2002.
U.S. patent application Ser. No. 10/185,273, Killen et al., filed Jun. 27, 2002.
U.S. patent application Ser. No. 10/308,500, Killen et al., filed Dec. 3, 2002.
U.S. patent application Ser. No. 10/373,935, Killen et al., filed Feb. 25, 2003.
U.S. patent application Ser. No. 10/404,285, Killen et al., filed Mar. 31, 2003.
U.S. patent application Ser. No. 10/404,981, Killen et al., filed Mar. 31, 2003.
U.S. patent application Ser. No. 10/404,960, Killen et al., filed Mar. 31, 2003.
U.S. patent application Ser. No. 10/185,144, Killen et al., filed Jun. 27, 2002.
U.S. patent application Ser. No. 10/185,266, Killen et al., filed Jun. 27, 2002.
U.S. patent application Ser. No. 10/185,162, Rumpf, Jr. et al., filed Jun. 27, 2002.
U.S. patent application Ser. No. 10/185,824, Killen et al., filed Jun. 27, 2002.
U.S. patent application Ser. No. 10/185,187, Killen et al., filed Jun. 27, 2002.
U.S. patent application Ser. No. 10/185,855, Killen et al., filed Jun. 27, 2002.
U.S. patent application Ser. No. 10/185,459, Killen et al., filed Jun. 27, 2002.
U.S. patent application Ser. No. 10/185,480, Killen et al., filed Jun. 27, 2002.
U.S. patent application Ser. No. 10/439,094, Delgado et al., filed May 15, 2003.
U.S. patent application Ser. No. 10/185,570, Killen et al., Jun. 27, 2002.
U.S. patent application Ser. No. 10/184,854, Killen et al., filed Jun. 27, 2002.
U.S. patent application Ser. No. 10/614,626, Zarro et al., filed Jul. 7, 2003.
Peng Thian Teo, et al: "Adaptive ferroelectric phased shifters for phased array antenna" Nov. 22, 1999, pp. 182–187.

HIGH EFFICIENCY THREE PORT CIRCUIT

BACKGROUND OF THE INVENTION

1. Statement of the Technical Field

The inventive arrangements relate generally to methods and apparatus for providing increased design flexibility for RF circuits,,and more particularly for optimization of dielectric circuit board materials for improved performance in three port circuits such as diplexers on microwave substrates.

2. Description of the Related Art

RF circuits such as three-port circuits and diplexers are commonly manufactured on specially designed substrate boards. For the purposes of RF circuits, it is important to maintain careful control over impedance characteristics and electrical length. If the impedance of different parts of the circuit does not match, this mismatch can result in inefficient power transfer, unnecessary heating of components, and other problems. A specific type of transmission line structure often used to match the impedances of different parts of the circuit is a quarter-wave transformer. Hence, the performance of quarter-wave transformers in printed circuits can be a critical design factor.

As the name implies, a quarter-wave transformer typically has an electrical line length of $\lambda/4$, where $\lambda$ is the signal wavelength in the circuit. As is well known by those skilled in the art, the proper characteristic impedance of a quarter-wave transformer is given by the formula $Z_0=\sqrt{Z_1 Z_2}$, where $Z_0$ is the desired characteristic impedance of the quarter-wave transformer, $Z_1$ is the impedance of a first transmission line to be matched, and $Z_2$ is the impedance of a second transmission line or load being matched to the first transmission line.

Printed quarter-wave transformers used in RF circuits can be formed in many ways. Three common implementations are described below. One configuration known as microstrip, places the quarter-wave transformer on a board surface and provides a second conductive layer, commonly referred to as a ground plane. A second type of configuration known as buried microstrip is similar except that the quarter-wave transformer is covered with a dielectric superstrate material. In a third configuration known as stripline, the quarter-wave transformer is sandwiched within substrate between two electrically conductive (ground) planes.

Two critical factors affecting the performance of a substrate material are permittivity (sometimes called the relative permittivity or $\in_r$) and the loss tangent (sometimes referred to as the dissipation factor). Another critical factor is the permeability (sometimes called the relative permeability or $\upsilon_r$. The relative permittivity and relative permeability determines the speed of the signal, and therefore the electrical length of transmission lines and other components implemented on the substrate. The loss tangent characterizes the amount of loss that occurs for signals traversing the substrate material. Accordingly, low loss materials become even more important with increasing frequency, particularly when designing receiver front ends and low noise amplifier circuits.

Ignoring loss, the characteristic impedance of a standard transmission line, such as stripline or microstrip, is equal to $\sqrt{L_l/C_l}$, where $L_l$ is the inductance per unit length and $C_l$ is the capacitance per unit length. The values of $L_l$ and $C_l$ are generally determined by the physical geometry and spacing of the line structure as well as the permittivity and permeability of the dielectric material(s) used to separate the transmission line structures. Conventional substrate materials typically have a relative permeability of approximately 1.0.

In conventional RF design, a substrate material is selected that has a relative permittivity value suitable for the design. Once the substrate material is selected, the line characteristic impedance value is exclusively adjusted by controlling the line geometry and physical structure.

The permittivity of the chosen substrate material for a transmission line, passive RF device, or radiating element influences the physical wavelength of RF energy at a given frequency for that line structure. One problem encountered when designing microelectronic RF circuitry is the selection of a dielectric board substrate material that is optimized for all of the various passive components and transmission line circuits to be formed on the board. In particular, the geometry of certain circuit elements may be physically large or miniaturized due to the unique electrical or impedance characteristics required for such elements. Similarly, the line widths required for exceptionally high or low characteristic impedance values can, in many instances, be too narrow or too wide respectively for practical implementation for a given substrate. Since the physical size of the microstrip or stripline is inversely related to the relative permittivity of the dielectric material, the dimensions of a transmission line can be affected greatly by the choice of substrate board material.

Still, an optimal board substrate material design choice for some components may be inconsistent with the optimal board substrate material for other components, such as antenna elements. Moreover, some design objectives for a circuit component may be inconsistent with one another. Accordingly, the constraints of a circuit board substrate having selected relative substrate properties often results in design compromises that can negatively affect the electrical performance and/or physical characteristics of the overall circuit.

An inherent problem with the foregoing approach is that, at least with respect to the substrate material, the only control variable for line impedance is the relative permittivity, $\in_r$. Changes in the relative permittivity affect $C_l$, the capacitance per unit length. This limitation highlights an important problem with conventional substrate materials, i.e. they fail to take advantage of the other material factor that determines characteristic impedance, namely the relative permeability, $\mu_r$. Changes in the relative permeability effect $L_l$, the inductance per unit length of the transmission line.

Yet another problem that is encountered in RF circuit design is the optimization of circuit components for operation on different RF frequency bands. Line impedances and lengths that are optimized for a first RF frequency band may provide inferior performance when used for other bands, either due to impedance variations and/or variations in electrical length. Such limitations can reduce the effective operational frequency range for a given RF system.

Conventional circuit board substrates are generally formed by processes such as casting or spray coating which generally result in uniform substrate physical properties, including the permittivity. Accordingly, conventional dielectric substrate arrangements for RF circuits have proven to be a limitation in designing circuits that are optimal in regards to both electrical and physical size characteristics.

SUMMARY OF THE INVENTION

The present invention relates to a circuit for processing radio frequency signals. The circuit includes a substrate where the circuit can be placed. The substrate can include a meta-material (which are described in more detail later) and can incorporate at least one dielectric layer. A three port circuit and at least one ground can be coupled to the substrate.

The dielectric layer can include a first region with a first set of substrate properties and at least a second region with a second set of substrate properties. The substrate properties can include permittivity and permeability. The second set of substrate properties can be different than the first set of substrate properties. In one embodiment the permittivity and/or permeability of the second region can be higher than the permittivity and/or permeability of the first region. Further, the first and/or second set of substrate properties can be differentially modified to vary dielectric permittivity or magnetic permeability or both over a selected region. The dielectric layer can further include other regions with different sets of substrate properties as desired.

At least a portion of the three port circuit can be coupled to the second region. The increased dielectric permittivities or magnetic permeabilities or both can reduce a size of the three port circuit. The increased permittivities or permeabilities or both also can effect a change in at least one of an impedance, an inductance, a capacitance, a quality factor (Q) and a voltage associated with the three port circuit.

DETAILED DESCRIPTION OF THE PREFERRED EMBODIMENTS

A three port circuit and more particularly a diplexer on a microwave substrate includes a quarter-wave transformer line section that is a specialized transmission line that typically is used in radio frequency (RF) circuits and commonly implemented on printed circuit boards or substrates. Quarter-wave transformers typically have a transmission line section, an input port and an output port. The electrical length of the transmission line section is usually one-quarter of a wavelength of a selected frequency, but a quarter-wave transformer also can be any odd multiple (2n+1) of the one-quarter wavelength.

Low permittivity printed circuit board materials are ordinarily selected for RF circuit designs implementing quarter-wave transformers. For example, polytetrafluoroethylene (PTFE) based composites such as RT/duroid® 6002 (permittivity of 2.94; loss tangent of 0.009) and RT/duroid® 5880 (permittivity of 2.2; loss tangent of 0.0007) are both available from Rogers Microwave Products, Advanced Circuit Materials Division, 100 S. Roosevelt Ave, Chandler, Ariz. 85226. Both of these materials are common board material choices. The above board materials provide dielectric layers having relatively low permittivities with accompanying low loss tangents.

However, use of conventional board materials can compromise the miniaturization of circuit elements and may also compromise some performance aspects of circuits that can benefit from high permittivity layers. A typical tradeoff in a communications circuit is between the physical size of a quarter-wave transformer versus operational frequency. By comparison, the present invention provides the circuit designer with an added level of flexibility by permitting use of a high permittivity dielectric layer region with the magnetic permeability properties optimized for reducing the size of a quarter-wave transformer, a stub resonator, a transmission line or other element for operation at a specific frequency. Further, the present invention also provides the circuit designer with means for controlling the quality factor (Q) of the quarter-wave transformer. This added flexibility enables improved performance and quarter-wave transformer density and performance not otherwise possible for RF circuits. As defined herein, RF means any frequency that can be used to propagate an electromagnetic wave.

Figure 1:
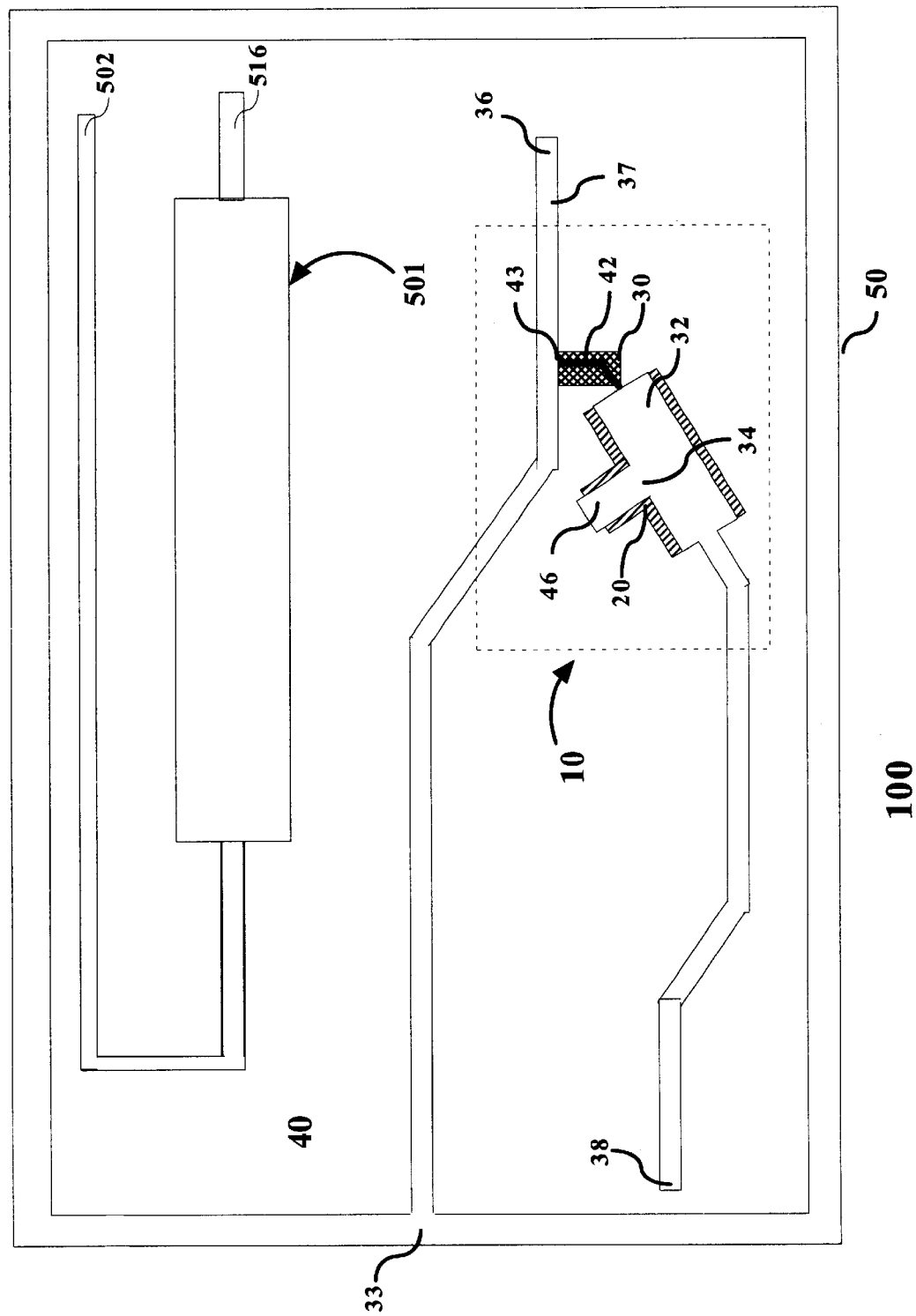
FIG. 1 is a top view of a three port circuit formed on a substrate for reducing the size of the three port circuit in accordance with the present invention.

FIG. 1 illustrates a top view of a three port circuit 100 and more particularly a diplexer 10 on a microwave substrate 50 in accordance with the present invention with a much smaller footprint than would be used on a conventional substrate of uniform substrate material. The three port circuit 100 includes a transformer section 32 coupled between respective ports 33, 36, and 38 as shown. The three port circuit 100 further includes stub section 46 connected to the transformer section 32 and transmission line section 42 coupled between the transformer section 32 and ports 33 and 36. The diplexer can include a substrate or dielectric layer 50 having a first region 40 having a first set of substrate properties and a second region 20 having a second set of substrate properties. The substrate 8 can also have other regions with yet another set of substrate properties such as region 30. The substrate properties can include a permittivity and a permeability. Notably, the second set of substrate properties can be different than the first set of substrate properties or from other sets of substrate properties on the substrate for other regions. For example, the second region 20 can have a higher permittivity and/or permeability than the first region 40.

Line sections or portions of line sections 32 or stub 46 can be mounted on or coupled to the dielectric layer or region 20 and can also be partially mounted or coupled to dielectric layer 40 if desired. Line sections 42, as shown, can be mounted on or coupled to the dielectric layer or region 30. The three port circuit 100 as shown thus includes port 33 serving as an input port for signals of two separate frequencies, port 36 serving as an output port for signals of a first frequency, and port 38 serving as an output port for signals of a second frequency. For example, port 33 can simultaneously carry L band signals in the 1 GHz range as well as Ku band signals in the 15 GHz range. Port 36 can be designed to serve as the output port for the Ku band signals and port 38 can be designed to serve as the output port for the L band signals using an appropriately designed diplexer 10. The three port circuit 100 can also include a ground plane on an opposing or bottom side of the substrate 50.

The three port circuit 100 of the present invention can be used in conjunction with an antenna feeder structure and an antenna (not shown). Preferably connected to the antenna is the three port circuit 100 in the form of an impedance matching diplexer which can have filters coupled between a common port connected to a proximal end of the antenna feeder structure, and respective further ports for connection to radio signal processing equipment operating in the two frequency bands. The filters can comprise a first filter tuned to an upper frequency which lies in one of the bands and at which the antenna is resonant in a first mode of resonance, and a second filter tuned to a lower frequency which lies in the other band and at which the antenna is resonant in a second mode of resonance.

In the first mode of resonance, the frequency of resonance is typically a function of the electrical lengths of the line elements, while the resonant frequency of the second mode of resonance is a function of the sum of (a) the electrical lengths of the elongate elements and (b) the electrical length of the sleeve of the antenna. In the general case, the electrical lengths of the elongate conductive elements are such as to produce an average transmission delay of, at least approximately, 180 degree at a resonant frequency associated with the first mode of resonance. The frequency of the second mode of resonance may be determined by the sum of the average electrical length of the conductive line elements and the average electrical length of the sleeve in the longitudinal direction corresponding to a transmission delay of at least approximately 180 degree at that frequency.

In the preferred embodiment, the diplexer comprises an impedance transforming element coupled between the common port and a node to which the filters and an impedance compensation stub are connected. The transforming element, the filters, and the stub are conveniently formed as microstrip components. In such a construction, the transforming element may comprise a conductive strip on an insulative substrate plate covered on its opposite face with a conductive ground layer. The strip forms, in conjunction with the ground layer, a transmission line of predetermined characteristic impedance. Similarly, the stub may be formed as a conductive strip having an open circuit end. Although the filters may be conventional "engine block" filters, they may instead be formed of microstrip elements on the same substrate as the transforming element and the stub. These filters are desirably connected to the above-mentioned node by conductors which are electrically short in comparison to the electrical lengths of the transforming element.

A transforming element of the diplexer 10 also comprises a length of line connected in series between the antenna feeder structure 36 and the diplexer node 43, such that the length of line is well matched at the first frequency (Ku-band) and is of a length such that the node 43 appears as an open circuit at the second frequency (L-band) at the antenna port, however, appearing well matched at the second frequency at port 33.

The antenna system typically operates over two frequency bands only, but it is possible within the scope of the invention to provide a circuit operative in more than two spaced apart bands, the antenna having a corresponding number of resonance modes.

The length of the transmission line forming the impedance transformer may be such as to effect a resistive impedance transformation at the upper frequency whereby the impedances at the node due to the transformer at the two frequencies has, respectively, a capacitive reactance component and an inductive reactance component, and wherein the stub length is such as to yield inductive and capacitive reactances respectively at the upper frequencies thereby at least partly compensating for the capacitive and inductive reactances due to the transformer so as to yield at the node a resultant impedance at the higher frequencies which is more highly resistive than the impedances of the transmission line at the lower frequency at node 38.

Typically, the transmission line lengths 42, 46, 32 are such as to provide a transmission delay of about 90 degrees at frequencies at the upper frequencies. The diplexer will typically have a pair of filters, at least one reactance compensating stub at one frequency and an impedance transforming element to match to devices operating at different bands and to isolate the signals of one with respect to the signals of the other.

Referring to FIG. 1, at port 33 there exists a signal in two bands of frequencies that, for example could be an L-band (a lower, intermediate frequency) and a higher frequency that, for example could be a Ku-band signal. The signal at port 38 can come from a received signal at port 502, filtered, and down converted to L-band by a circuit 501 configured to have an input port 502 and an output port 516 as shown. The signal that is the output of circuit 501 is also at port 38, passed through a filter that separates (isolates) the L-band signal from the uplink carrier (for example, a frequency 10 times higher) that also exists on line 37 (formed between ports 33 and 36) and is connected to the antenna output port 36. The diplexer can also be coupled to a feed cable that feeds the uplink carrier signal at port 33.

Referring to FIG. 1 again, the diplexer 10 comprises a stepped impedance/stub combination composed of lines 42 (quarter wave at the carrier frequency), 32 (half wave at the carrier frequency) and 46 (quarter wave at the carrier frequency) to form a stop band filter to the (Ku band) carrier, but pass the L-band, down converted, L-band, receive frequency. The diplexer 10 further comprises the combination of line 42 and line 37 which are arranged and constructed to have dimension and line characteristics making such combination act like an open stub to the low frequencies of the L-band.

Transforming section 32 is dimensioned to have a characteristic transmission line impedance $Z_0$ given by:

$$Z_0 = \text{sqroot}.(Z_s Z_L)^{\sqrt{(ZS\ ZL)}}$$

where $Z_0$ is the characteristic impedance of the line 37 at a frequency down converted from the carrier frequency of line 37, and $Z_L$ is a selected load impedance. Line sections of 32, 42, and 46 are chosen to form a band stop filter at the carrier frequency (at the Ku-band, for example).

As shown in FIG. 1 in accordance with the present invention, transformer line sections, transmission line sections, and stub resonator sections can be used as shown with lengths and widths varying in shape (width, length, etc.) as desired depending on the substrate material used to couple to such elements. Depending on the desired characteristics, additional elements can be designed and implemented having varying shapes without so many restraints regarding manufacturability or size.

A ground plane can be provided beneath the quarter-wave transformer line section or sections. Accordingly, dielectric layer 50c an have a thickness that defines a quarter-wave transformer height above ground. The thickness is approximately equal to the physical distance from the quarter-wave transformer to the underlying ground plane. This distance can be adjusted to achieve particular dielectric geometries, for example, to increase or decrease capacitance when a certain dielectric material is used.

The propagation velocity of a signal traveling on the quarter-wave transformer sections is proportional to $$\frac{1}{\sqrt{mrer}}.$$

Since propagation velocity is inversely proportion to relative permeability and relative permittivity, increasing the permeability and/or permittivity in the second region 20 decreases propagation velocity of the signal on the quarter-wave transformer sections, and thus the signal wavelength. Hence, the length of the quarter-wave transformer sections can be reduced by increasing the permeability and/or permittivity of the second region 20. Further, an increase in permittivity increases the capacitive coupling between the quarter-wave transformer sections and the ground. Thus, the quarter-wave transformer surface area also can be reduced by increasing the permittivity of the second region 20. Accordingly, the quarter-wave transformer sections can be smaller, both in length and width, than would otherwise be required on a conventional circuit board.

The permittivity and/or permeability can be chosen to result in a desired characteristic impedance ($Z_0$) (since $Z_0$ is proportional to $$\sqrt{\frac{mr}{\mu r}}$$

for the quarter-wave transformer sections as well, or to control inductance or resistance values associated with the quarter-wave transformer sections. For example, the permeability the second region 20 can be increased to increase the inductance of the quarter-wave transformer sections.

In one embodiment of the invention the permeability of the dielectric layer 50 can be controlled to increase the inductance of all or part of the quarter-wave transformer section(s). In another embodiment (not shown), the quarter-wave transformer section(s) can have its own individual ground plane or return trace (such as in a twin line arrangement) configured so that current on the ground plane or return trace flows in an opposite direction to current flowing in the quarter-wave transformer section(s), thereby resulting in cancellation of magnetic flux associated with the quarter-wave transformer section(s) and lowering its inductance.

The permittivity and/or permeability can be differentially modified at selected regions of the dielectric layer to optimize quarter-wave transformer performance. In yet another arrangement, all dielectric layer regions can be modified by differentially modifying permittivity and/or permeability in all regions of the dielectric layer.

The term "differential modifying" as used herein refers to any modifications, including additions, to the dielectric layer 50 that result in at least one of the dielectric and magnetic properties being different at one region of the substrate as compared to another region. For example, the modification can be a selective modification where certain dielectric layer regions are modified to produce a specific dielectric or magnetic properties, while other dielectric layer regions are left un-modified.

According to one embodiment (not shown), a supplemental dielectric layer can be added to dielectric layer 50. Techniques known in the art such as various spray technologies, spin-on technologies, various deposition technologies or sputtering can be used to apply the supplemental layer. A first supplemental layer can be added over the entire existing dielectric layer 50 and/or a second supplemental layer can be selectively added in the second region 20 or selected portions thereof to change the permittivity and/or permeability of the dielectric beneath quarter-wave transformer section as well as stub section 46. In alternate embodiment, the supplemental layer can be added to the first region 40 or selected portions thereof or to other regions. For example, the supplemental layer can be added below the transmission line 42 in region 30 to increase the permittivity and/or permeability in that region.

Notably, the supplemental layer can include particles to change the relative permeability in the first and/or second regions or other regions to be greater or less than 1. For example, diamagnetic or ferromagnetic particles can be added to any of the regions. Further, dielectric particles can be added to either of the regions as well. Additionally, the first supplemental layer and the second supplemental layer can be provided in any circuit configuration, for example stripline, microstrip and buried microstrip.

Figure 2:
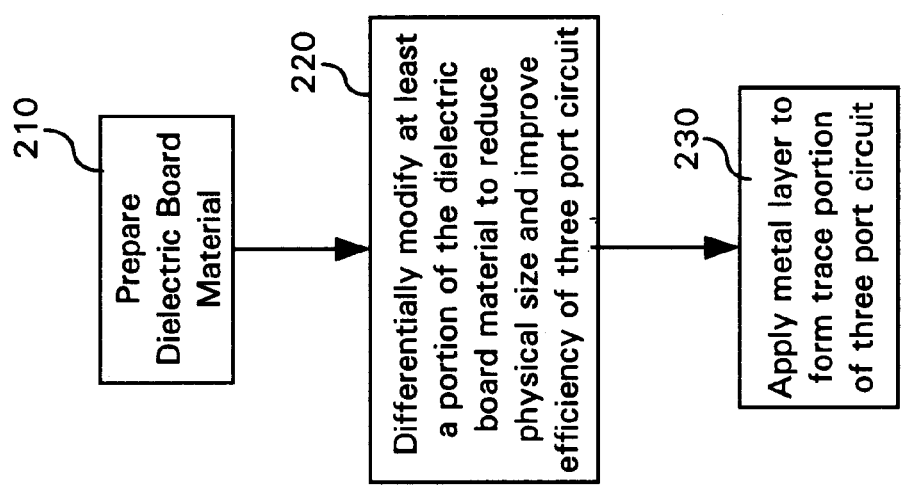
FIG. 2 is a flow chart that is useful for illustrating a process for manufacturing a three port circuit of reduced physical size in accordance with the present invention.

A method for providing a size and performance optimized quarter-wave transformer is described with reference to the text below and the flow chart presented in FIG. 2. In step 210, board dielectric material is prepared for modification. As previously noted, the board material can include commercially available off the shelf board material or customized board material formed from a polymer material, or some combination thereof. The preparation process can be made dependent upon the type of board material selected.

In step 220, one or more dielectric layer regions, such as the first and second regions 40 and 20, can be differentially modified so that the permittivity and/or permeability differ between two or more portions of the regions. The differential modification can be accomplished in several different ways, as previously described. Referring to step 230, the metal layer then can be applied to the quarter-wave transformer sections and the three port circuit using standard circuit board techniques known in the art.

Dielectric substrate boards having meta-material regions providing localized and selectable magnetic and substrate properties can be prepared in the following manner. As defined herein, the term "meta-materials" refers to composite materials formed from the mixing or arrangement of two or more different materials at a very fine level, such as the molecular or nanometer level. Meta-materials allow tailoring of electromagnetic properties of the composite, which can be defined by effective electromagnetic parameters comprising effective electrical permittivity $\in_{eff}$ (or permittivity) and the effective magnetic permeability $\mu_{eff}$.

Appropriate bulk dielectric substrate materials can be obtained from commercial materials manufacturers, such as DuPont and Ferro. The unprocessed material, commonly called Green Tape™, can be cut into sized regions from a bulk dielectric tape, such as into 6 inch by 6 inch regions. For example, DuPont Microcircuit Materials provides Green Tape material systems, such as 951 Low-Temperature Cofire Dielectric Tape and Ferro Electronic Materials ULF28-30 Ultra Low Fire COG dielectric formulation. These substrate materials can be used to provide dielectric layers having relatively moderate permittivities with accompanying relatively low loss tangents for circuit operation at microwave frequencies once fired.

In the process of creating a microwave circuit using multiple sheets of dielectric substrate material, features such as vias, voids, holes, or cavities can be punched through one or more layers of tape. Voids can be defined using mechanical means (e.g. punch) or directed energy means (e.g., laser drilling, photolithography), but voids can also be defined using any other suitable method. Some vias can reach through the entire thickness of the sized substrate, while some voids can reach only through varying regions of the substrate thickness.

The vias can then be filled with metal or other dielectric or magnetic materials, or mixtures thereof, usually using stencils for precise placement of the backfill materials. The individual layers of tape can be stacked together in a conventional process to produce a complete, multi-layer substrate. Alternatively, individual layers of tape can be stacked together to produce an incomplete, multi-layer substrate generally referred to as a sub-stack.

Voided regions can also remain voids. If backfilled with selected materials, the selected materials preferably include meta-materials. The choice of a meta-material composition can provide tunable effective dielectric constants over a relatively continuous range from less than 2 to about 2650. Tunable magnetic properties are also available from certain meta-materials. For example, through choice of suitable materials the relative effective magnetic permeability generally can range from about 4 to 116 for most practical RF applications. However, the relative effective magnetic permeability can be as low as about 2 or reach into the thousands.

The term "differentially modified" as used herein refers to modifications, including dopants, to a dielectric substrate layer that result in at least one of the dielectric and magnetic properties being different at one region of the substrate as compared to another region. A differentially modified board substrate preferably includes one or more meta-material containing regions.

For example, the modification can be selective modification where certain dielectric layer regions are modified to produce a first set of dielectric or magnetic properties, while other dielectric layer regions are modified differentially or left unmodified to provide dielectric and/or magnetic properties different from the first set of properties. Differential modification can be accomplished in a variety of different ways.

According to one embodiment, a supplemental dielectric layer can be added to the dielectric layer. Techniques known in the art such as various spray technologies, spin-on technologies, various deposition technologies or sputtering can be used to apply the supplemental dielectric layer. The supplemental dielectric layer can be selectively added in localized regions, including inside voids or holes, or over the entire existing dielectric layer. For example, a supplemental dielectric layer can be used for providing a substrate region having an increased effective dielectric constant. The dielectric material added as a supplemental layer can include various polymeric materials.

The differential modifying step can further include locally adding additional material to the dielectric layer or supplemental dielectric layer. The addition of material can be used to further control the effective dielectric constant or magnetic properties of the dielectric layer to achieve a given design objective.

The additional material can include a plurality of metallic and/or ceramic particles. Metal particles preferably include iron, tungsten, cobalt, vanadium, manganese, certain rare-earth metals, nickel or niobium particles. The particles are preferably nanosize particles, generally having sub-micron physical dimensions, hereafter referred to as nanoparticles.

The particles, such as nanoparticles, can preferably be organofunctionalized composite particles. For example, organofunctionalized composite particles can include particles having metallic cores with electrically insulating coatings or electrically insulating cores with a metallic coating.

Magnetic meta-material particles that are generally suitable for controlling magnetic properties of dielectric layer for a variety of applications described herein include ferrite organoceramics (FexCyHz)-(Ca/Sr/Ba-Ceramic). These particles work well for applications in the frequency range of 8–40 GHz. Alternatively, or in addition thereto, niobium organoceramics (NbCyHz)-(Ca/Sr/Ba-Ceramic) are useful for the frequency range of 12–40 GHz. The materials designated for high frequency are also applicable to low frequency applications. These and other types of composite particles can be obtained commercially.

In general, coated particles are preferable for use with the present invention as they can aid in binding with a polymer matrix or side chain moiety. In addition to controlling the magnetic properties of the dielectric, the added particles can also be used to control the effective dielectric constant of the material. Using a fill ratio of composite particles from approximately 1 to 70%, it is possible to raise and possibly lower the dielectric constant of substrate dielectric layer and/or supplemental dielectric layer regions significantly. For example, adding organofunctionalized nanoparticles to a dielectric layer can be used to raise the dielectric constant of the modified dielectric layer regions.

Particles can be applied by a variety of techniques including polyblending, mixing and filling with agitation. For example, a dielectric constant may be raised from a value of 2 to as high as 10 by using a variety of particles with a fill ratio of up to about 70%. Metal oxides useful for this purpose can include aluminum oxide, calcium oxide, magnesium oxide, nickel oxide, zirconium oxide and niobium (II, IV and V) oxide. Lithium niobate ($LiNbO_3$), and zirconates, such as calcium zirconate and magnesium zirconate, also may be used.

The selectable substrate properties can be localized to areas as small as about 10 nanometers, or cover large area regions, including the entire board substrate surface. Conventional techniques such as lithography and etching along with deposition processing can be used for localized dielectric and magnetic property manipulation.

Materials can be prepared mixed with other materials or including varying densities of voided regions (which generally introduce air) to produce effective dielectric constants in a substantially continuous range from 2 to about 2650, as well as other potentially desired substrate properties. For example, materials exhibiting a low dielectric constant (<2 to about 4) include silica with varying densities of voided regions. Alumina with varying densities of voided regions can provide a dielectric constant of about 4 to 9. Neither silica nor alumina have any significant magnetic permeability. However, magnetic particles can be added, such as up to 20 wt. %, to render these or any other material significantly magnetic. For example, magnetic properties may be tailored with organofunctionality. The impact on dielectric constant from adding magnetic materials generally results in an increase in the dielectric constant.

Medium dielectric constant materials have a dielectric constant generally in the range of 70 to 500+/−10%. As noted above these materials may be mixed with other materials or voids to provide desired effective dielectric constant values. These materials can include ferrite doped calcium titanate. Doping metals can include magnesium, strontium and niobium. These materials have a range of 45 to 600 in relative magnetic permeability.

For high dielectric constant applications, ferrite or niobium doped calcium or barium titanate zirconates can be used. These materials have a dielectric constant of about 2200 to 2650. Doping percentages for these materials are generally from about 1 to 10%. As noted with respect to other materials, these materials may be mixed with other materials or voids to provide desired effective dielectric constant values.

These materials can generally be modified through various molecular modification processing. Modification processing can include void creation followed by filling with materials such as carbon and fluorine based organo functional materials, such as polytetrafluoroethylene PTFE.

Alternatively or in addition to organofunctional integration, processing can include solid freeform fabrication (SFF), photo, uv, x-ray, e-beam or ion-beam irradiation. Lithography can also be performed using photo, uv, x-ray, e-beam or ion-beam radiation.

Different materials, including meta-materials, can be applied to different areas on substrate layers (sub-stacks), so that a plurality of areas of the substrate layers (sub-stacks) have different dielectric and/or magnetic properties. The backfill materials, such as noted above, may be used in conjunction with one or more additional processing steps to attain desired, dielectric and/or magnetic properties, either locally or over a bulk substrate region.

A top layer conductor print is then generally applied to the modified substrate layer, sub-stack, or complete stack. Conductor traces can be provided using thin film techniques, thick film techniques, electroplating or any other suitable technique. The processes used to define the conductor pattern include, but are not limited to standard lithography and stencil.

A base plate is then generally obtained for collating and aligning a plurality of modified board substrates. Alignment holes through each of the plurality of substrate boards can be used for this purpose.

The plurality of layers of substrate, one or more sub-stacks, or combination of layers and sub-stacks can then be laminated (e.g. mechanically pressed) together using either isostatic pressure, which puts pressure on the material from all directions, or uniaxial pressure, which puts pressure on the material from only one direction. The laminate substrate is then is further processed as described above or placed into an oven to be fired to a temperature suitable for the processed substrate (approximately 850 C to 900 C. for the materials cited above).

The plurality of ceramic tape layers and stacked sub-stacks of substrates can then be fired, using a suitable furnace that can be controlled to rise in temperature at a rate suitable for the substrate materials used. The process conditions used, such as the rate of increase in temperature, final temperature, cool down profile, and any necessary holds, are selected mindful of the substrate material and any material backfilled therein or deposited thereon. Following firing, stacked substrate boards, typically, are inspected for flaws using an optical microscope.

The stacked ceramic substrates can then be optionally diced into cingulated pieces as small as required to meet circuit functional requirements. Following final inspection, the cingulated substrate pieces can then be mounted to a test fixture for evaluation of their various characteristics, such as to assure that the dielectric, magnetic and/or electrical characteristics are within specified limits.

Thus, dielectric substrate materials can be provided with localized tunable dielectric and/or magnetic characteristics for improving the density and performance of circuits, including those comprising quarter-wave transformers. The dielectric flexibility allows independent optimization of circuit elements.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as described in the claims.

What is claimed is:

1. A circuit for processing radio frequency signals, comprising:
    a substrate including at least one dielectric layer, said dielectric layer having a first region and at least a second region, said first region having a first set of substrate properties and said second region having a second set of substrate properties, said second set of substrate properties providing different substrate characteristics than said first set of substrate properties;
    at least one ground coupled to said substrate; and,
    a three port circuit coupled to said substrate;
    wherein at least a portion of said three port circuit is coupled to said second region.

2. The circuit of claim 1 wherein said substrate comprises meta-material.

3. The circuit of claim 1 wherein at least one of said first set of substrate properties and said second set of substrate properties is differentially modified to vary at least one of a permittivity and a permeability over a selected region.

4. The circuit of claim 1 wherein said first set of substrate properties comprises a first permittivity and said second set of substrate properties comprises a second permittivity, said second permittivity being higher than said first permittivity.

5. The circuit of claim 4 wherein a propagation velocity of a signal on a quarter-wave transformer section of said three port circuit coupled to said second region is lower than a propagation velocity of a signal on a portion of line coupled to said first region.

6. The circuit of claim 1, wherein the three port circuit comprises a three port diplexer.

7. The circuit of claim 4 wherein said second permittivity is higher than said first permittivity to effect a change in at least one electrical characteristic of a quarter-wave transformer section of the three port circuit.

8. The circuit of claim 7 wherein said electrical characteristic is selected from the group comprising an impedance, an inductance, a capacitance, quality factor Q and a voltage.

9. The circuit of claim 1 wherein said first set of substrate properties comprises a first permeability and said second set of substrate properties comprises a second permeability, said second permeability being higher than said first permeability.

10. The circuit of claim 9 wherein a propagation velocity of a signal on a quarter-wave transformer section of said three port circuit coupled to said second region is lower than a propagation velocity of a signal on a transmission line coupled to said first region.

11. A printed circuit for processing radio frequency signals, comprising:
    a substrate upon which said circuit can be placed, said substrate including at least one dielectric layer, said dielectric layer having a first set of dielectric properties over a first region, and at least a second set of dielectric properties over a second region, said second set of dielectric properties providing a different dielectric permittivity and magnetic permeability as compared to said first set of dielectric properties;
    at least one ground coupled to said substrate; and,
    a three port circuit including at least one quarter-wave transformer line section wherein at least a portion of the quarter-wave transformer line section being coupled to at least a portion of said second region.

12. The circuit of claim 11 wherein at least one of said first set of dielectric properties and said second set of dielectric properties is controlled to reduce a size of said three port circuit.

13. The circuit of claim 11 wherein at least one of said first set of dielectric properties and said second set of dielectric properties is controlled to adjust a capacitance between said coupled three port circuit and another metallic structure.

14. The circuit of claim 11 wherein at least one of said first set of dielectric properties and said second set of dielectric properties is controlled to adjust the quality factor Q of said three port circuit.

15. The circuit of claim 11, wherein the three port circuit further comprises a stub connected to the at least one one quarter-wave transformer line section.

16. A printed circuit for processing radio frequency signals, comprising:

a substrate including substrate regions upon which said circuit can be placed, wherein said circuit is three port circuit, said three port circuit including at least one quarter-wave transformer section and at least one stub resonator connected to the at least one quarter-wave transformer section; and at least one ground coupled to said substrate, wherein at least one of the quarter-wave transformer section and the stub resonator are at least partially coupled to respective substrate regions that have substrate characteristics that are each independently customizable.

17. The printed circuit of claim 16, wherein the substrate characteristics that are each independently customizable are selected from the group comprising dielectric permittivity and magnetic permeability.

* * * * *

UNITED STATES PATENT AND TRADEMARK OFFICE
CERTIFICATE OF CORRECTION

PATENT NO. : 6,753,744 B2
DATED : June 22, 2004
INVENTOR(S) : Killen et al.

It is certified that error appears in the above-identified patent and that said Letters Patent is hereby corrected as shown below:

Column 1,
Line 50, delete "∈" and replace with -- $\varepsilon$ --

Column 2,
Line 41, delete "∈" and replace with -- $\varepsilon$ --

Column 6,
Line 26, delete "$Z_0 =.\text{sqroot}.(Z_s Z_L)$ $\sqrt{(ZS\,ZL)}$" and replace with -- $Z_0 = \sqrt{Z_s Z_L}$ --

Line 45, delete "50c an" and replace with -- 50 can --

Line 55, delete "$\frac{1}{\sqrt{mrer}}$" and replace with -- $\frac{1}{\sqrt{\mu_r \varepsilon_r}}$ --

Column 7,
Line 10, delete "$\sqrt{\frac{mr}{\mu r}}$" and replace with -- $\sqrt{\frac{\mu_r}{\varepsilon_r}}$ --

Column 11,
Line 27, delete "C." and replace with -- C --

Signed and Sealed this

Twenty-first Day of June, 2005

JON W. DUDAS
*Director of the United States Patent and Trademark Office*